Figure 1:
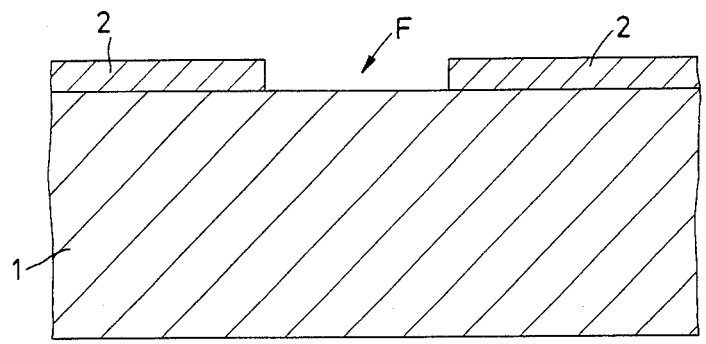

United States Patent [19]

Meignant

[11] Patent Number: 4,517,730

[45] Date of Patent: May 21, 1985

[54] METHOD OF PROVIDING A SMALL-SIZED OPENING, USE OF THIS METHOD FOR THE MANUFACTURE OF FIELD EFFECT TRANSISTORS HAVING AN ALIGNED GATE IN THE SUBMICRON RANGE AND TRANSISTORS THUS OBTAINED

[75] Inventor: Didier S. Meignant, Emerainville, France

[73] Assignee: U.S. Philips Corporation, New York, N.Y.

[21] Appl. No.: 528,353

[22] Filed: Aug. 31, 1983

[30] Foreign Application Priority Data

Sep. 1, 1982 [FR] France ............................... 82 14944

[51] Int. Cl.³ ............................................ H01L 39/22
[52] U.S. Cl. ....................................... 29/571; 29/579; 29/589; 29/590; 357/15; 357/22; 156/651
[58] Field of Search ................ 29/571, 579, 589, 590, 29/591, 578; 357/15, 22, 41, 68, 65; 156/650, 651, 652, 653

[56] References Cited

U.S. PATENT DOCUMENTS

| 3,898,353 | 8/1975 | Napoli et al. | 427/91 X |
| 4,077,111 | 3/1978 | Driver et al. | 29/579 X |
| 4,194,285 | 3/1980 | Goel | 29/589 X |
| 4,334,349 | 6/1982 | Aoyama et al. | 29/579 |
| 4,414,738 | 11/1983 | Jelks et al. | 29/579 |

Primary Examiner—Brian E. Hearn
Assistant Examiner—David A. Hey
Attorney, Agent, or Firm—Paul R. Miller

[57] ABSTRACT

The invention relates to a method of providing a small-sized opening for manufacturing semiconductors, such as field effect transistors having an aligned gate in the submicron range, as well as to transistors obtained by this method. In general, the invention consists in that an intermediate window is formed to provide the aligned gate in a semiconductor, which window is eliminated after forming the gate. The invention is used in the field of electronics, more particularly, in the manufacture of semiconductor elements.

9 Claims, 8 Drawing Figures

METHOD OF PROVIDING A SMALL-SIZED OPENING, USE OF THIS METHOD FOR THE MANUFACTURE OF FIELD EFFECT TRANSISTORS HAVING AN ALIGNED GATE IN THE SUBMICRON RANGE AND TRANSISTORS THUS OBTAINED

The invention relates to a method of providing a small-sized opening and to the use of this method for the manufacture of field effect transistors having an aligned gate in the submicron range as well as to the transistors obtained by the use of this method. Generally, the invention is applied to the field of electronics and more particularly the technology of manufacturing semiconductor elements.

Such manufacturing methods are known from the prior art and mention is made, for example, of French Patent application No. 80 27 423 filed on Dec. 24$^{th}$ 1980 in the name of the Applicant and describing also a method of manufacturing FET transistors having a gate in the submicron range and a Schottky drain without a mask in the submicron range by under-etching along one central alignment edge.

This method especially permits of obtaining FET transistors having a gate in the submicron range without a mask in the submicron range by adequate use of a conventional technique, such as photo-etching.

However, the FET transistors obtained by the use of the method described in the aforementioned application are very special transistors having a Schottky drain and the method could not be applied to the manufacture of the most general transistors.

Consequently, the present invention has for its object to describe a more general method of providing a small-sized opening which permits of obtaining in a very special application all kinds of field effect transistors, more particularly conventional FET transistors having drain and source electrodes in the form of ohmic contacts and a Schottky gate.

The method according to the present invention is characterised in that it comprises the following steps:
(a) depositing on the substrate a layer of a lacquer sensitive to radiations of small wave-length, a layer of a material opaque to these radiations and a second layer of a lacquer sensitive to radiations of larger wave-lengths;
(b) exposure to the radiations of large wave-length through a mask which exposes an entire zone of the substrate thus covered;
(c) dissolving the exposed part of the second lacquer layer;
(d) attacking the layer of opaque material, not covered with lacquer, which step is continued until an under-etching is obtained over a distance typically less than 1 micron;
(e) depositing a new layer of opaque material by alignment along the edge covered with the second lacquer layer;
(f) dissolving the non-exposed second lacquer layer;
(g) exposure to radiation of smaller wave-length;
(h) dissolving the first exposed lacquer layer;
(i) etching the substrate so as to provide a small-sized opening; and
(j) dissolving the first non-exposed lacquer layer.

Thus, an opening is obtained having a dimension in the submicron range without using a mask in the submicron range by alignment along an intermediate figure which disappears after use.

In order that the invention may be readily carried into effect, it will now be described more fully, by way of example, with reference to the accompanying drawings, in which:

FIGS. 1 to 8 show the various stages of the method according to the invention for the manufacture of FET transistors.

The methods of manufacturing FET transistors by self-alignment are well known from the prior art and are described, for example, in French Pat. No. 1,437,781 in the name of N. V. Phillips' Gloeilampenfabrieken according to an additive modification and in U.S. Pat. No. 3,678,573 in the name of Westinghouse Electric Corp. according to a subtractive modification.

However, these methods of photo-etching through masks have a limitation inherent to the means used and residing in the phenomena of diffraction of the radiations utilized, which are generally ultraviolet radiations for exposing the lacquer systems used and which require the use of openings having a dimension of more than 1 micron.

French Patent Specification No. 8027423 filed on Dec. 24$^{th}$ 1980 in the name of the Applicant permits the provision of openings having a dimension of less than 1 micron, for example, of the order of 0.5 $\mu$m, by an adequate use of photo-etching and underetching techniques, but the method thus described was used only for special transistors having a Schottky drain.

From the prior art, especially from the magazine IBM Technical Disclosure Bulletin, Vol. 19, No. 11, April 1977, p. 4089–4090, a method is also known of providing spaces of dimensions in the submicron range by simultaneously under-etching the two edges of a window of the order of 1 $\mu$m and depositing a protective layer by alignment along the two edges, while leaving free two lateral zones over a distance which can be less than 1 $\mu$m.

The method according to the invention differs from the latter by the means used—no under-etching of the two edges of a window and no deposition either of a protective layer—and by the results obtained—a single space in the submicron range—as is illustrated by the following description of the Figures which show the method in a special embodiment.

The semiconductor material 1 according to FIG. 1 is, for example, gallium aresenide (GaAs), on which is deposited a first metallic layer 2 of a metal or an alloy forming an ohmic contactact, for example, of an alloy of gold-germanium(Au-Ge=80/20), applied, for example, by vapour deposition. This vapour deposition can be effected on the entire surface of the semiconductor, which does not prevent that afterwards material is removed by the conventional photo-etching techniques so that a first window F in the micron range is opened, or solely on limited zones so that the source and drain electrodes are formed, the other parts of the surface being protected by covering layers, this second modification being most frequently used nowadays.

Figure 2:
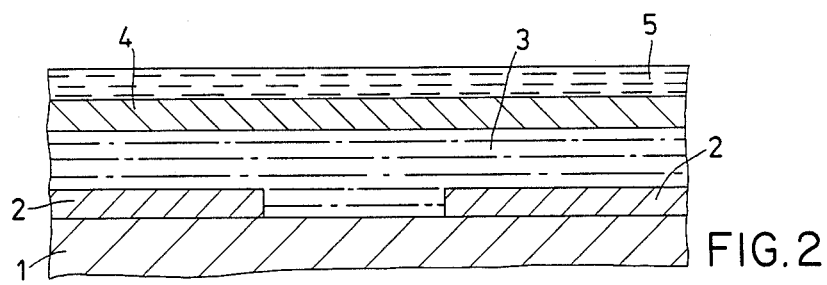

A second layer 3 of a lacquer sensitive to radiations of small wave-length, as deep ultraviolet radiations or X-rays, for example, of PMMA, is then deposited, as shown in FIG. 2, after which a third layer 4 of a material opaque to these radiations, such as silica ($SiO_2$) or silicon nitride ($Si_3N_4$) or even various metals, such as aluminium (Al), tantalum (Ta) or gold (Au), is deposited, for example, by evaporation; finally, a fourth layer 5 of a lacquer sensitive to ultraviolet radiations, for example, the lacquer marketed by Shipley under the designation AZ 1350, having a small thickness of the order of 5000 Å, is deposited.

Figure 3:
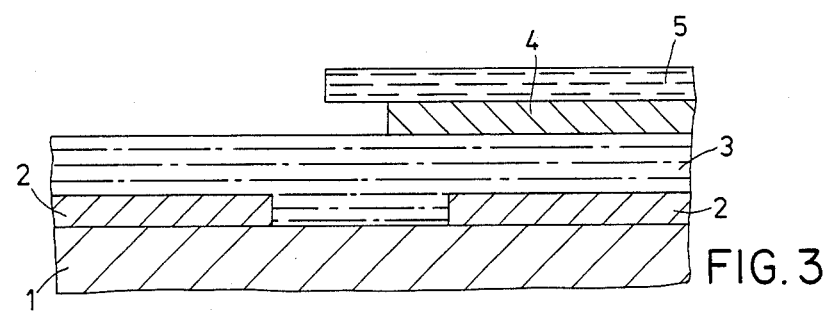
Figure 4:
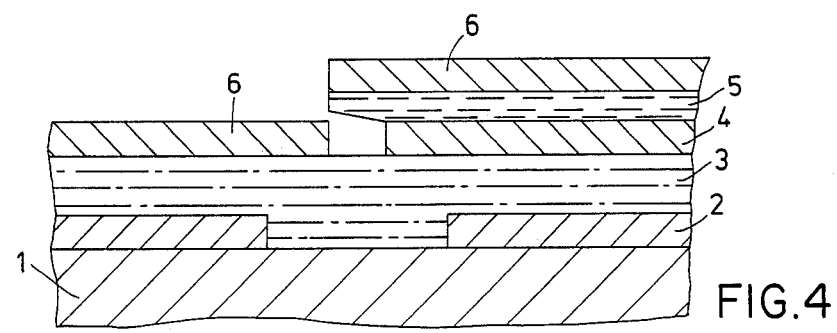
Figure 5:
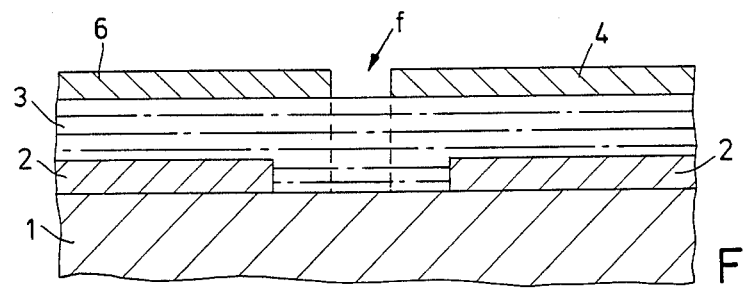
Figure 6:
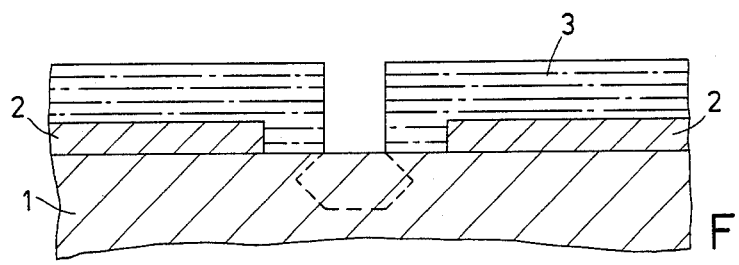
Figure 7:
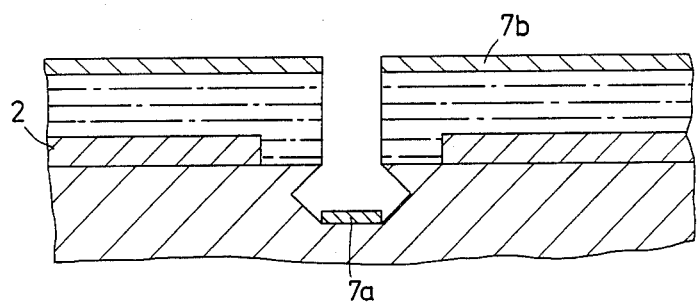

The substrate thus coated is then exposed to a sensitizing radiation, for example, ultraviolet radiations, through a mask which at its center exposes the field effect transistor along the main center line of the first window F in the micron range, as shown in FIG. 3, and the sensitized lacquer is removed by means of a common solvent, such as a diluted basic solution (for example, a solution of diluted soda), after which the opaque layer 4 of, for example, silica (SiO$_2$) or tantalum (Ta) is etched by means of, for example, a CF$_4$/O$_2$ plasma and under-etched over a distance typically less than 1 micron, for example, of the order of 0.5 μm, under the remaining part of the lacquer layer 5, in a perfectly accurate and controlled manner, for example, over this distance of 0.5 μm in a time of the order of a few minutes. The periphery is perfectly regular with irregularities which do not exceed 100 Å.

Subsequently, a new layer 6 of the same material as that of the third layer, for example, silica (SiO$_2$) is deposited while utilizing the shadow effect obtained by the under-etching; due to the alignment along the single central edge of the remaining lacquer layer 5, a non-coated zone of constant size in the submicron range is obtained owing to the shadow effect, which consequently constitutes a second window f in the submicron range, which is intermediate, for it will disappear after use.

The non-sensitized lacquer 5 is then removed by means of a suitable solvent. In the case of a fine positive lacquer, such as the lacquer of the type Shipley AZ 1350, acetone is particularly suitable for this purpose. When this lacquer layer is removed, the layer 6 of inert material, which has deposited on this lacquer layer 5, is also removed (so-called "lift-off" or, more specifically, peeling method). According to FIG. 5, two windows fitting into each other are then obtained, the first of which (F) lies in the micron range and the second (f) in the submicron range.

Subsequently, the assembly is exposed again, for example, to X-radiation or deep UV radiation in the case of the use of a thick PMMA lacquer, after which the part of exposed lacquer is attacked by means of, for example, isobutyl methyl ketone, the suitable development solutions varying as a function of the lacquer used, but being generally indicated and supplied by the manufacturer. The intermediate window f in the submicron range can then be extended to semiconductor layer 1 by means of, for example, a freon/oxygen (CF$_4$/O$_2$) plasma according to FIG. 6.

The semiconductor layer is then etched in the zone not covered with the lacquer; in case gallium arsenide is chosen as semiconductor material, a suitable etching solution is, for example, diluted citric acid and a cavity is thus obtained whose form essentially depends upon the attacking solution, but may also depend upon a plurality of other parameters, such as the crystallographic orientation etc. It is then possible to deposit another metallic layer 7 of a metal which will form a rectifying contact with the semiconductor material, for example, aluminium, which will cover the bottom of this cavity (7a), but which, due to a shadow effect maintained by the vertical walls of the lacquer layer 3, will be perfectly limited and self-aligned with respect to the walls, according to FIG. 7.

Figure 8:
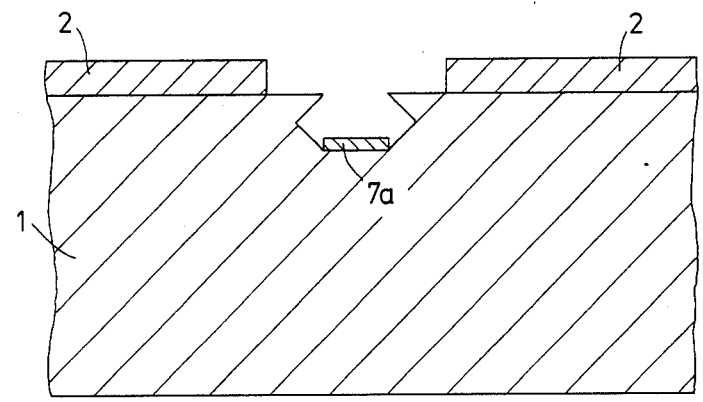

The final product, after removal of the remaining non-exposed lacquer 3, for example, by means of trichloroethylene, and of the parts of the upper metallic layer (7b) by peeling, is shown in FIG. 8.

This final product, here a field effect transistor having a Schottky gate, is precisely distinguished from other transistors obtained by other known methods in that the cavity provided in the semiconductor material is neither defined nor limited by the metallic layers 2 forming the source and drain electrodes.

It will be clear to those skilled in the art that numerous modifications are possible without departing from the scope of the invention. Thus, the rectifying contact formed by the last metallic layer 7 may be made of aluminium, but also of other metals, such as, for example, the succession of metallic layers of titanium/platinum/gold and the like. Further, the choice of lacquers may vary indefinitely, but the chosen pair is not entirely free in that the chemical solutions for removing these (exposed or non-exposed) lacquers have to be different in order that during the first immersion intended to remove a part of the upper layer (5) the lower layer (3) does not change at all and in that the sensitizing radiation (UV radiation) of the upper lacquer layer (5) has a larger wave-length than the X- or deep UV radiation of the lower lacquer layer (3) so that it is held back by the third layer (4) disposed between these two lacquer layers. Finally and especially the method is not limited to the manufacture of FET transistors, but includes all kinds of industrial products.

What is claimed is:

1. A method of providing a small-sized opening in a substrate, characterised in that the following succession of steps is carried out:
    (a) depositing on the substrate a layer of a first lacquer sensitive to radiations of small wave-length, a first layer of a material opaque to these radiations and a layer of a second lacquer sensitive to radiations of larger wave-lengths;
    (b) exposing an entire zone of said substrate thus coated to radiation of a larger waver-length through a mask;
    (c) dissolving the exposed part of said second lacquer;
    (d) attacking said first layer of opaque material not coated with said second lacquer until an under-etching is obtained below said second lacquer over a distance typically less than 1 μm;
    (e) depositing a new layer of opaque material by alignment along the exposed edge of said second lacquer;
    (f) dissolving remaining portions of said second lacquer;
    (g) exposing said layer of first lacquer to radiation of small wave-length;
    (h) dissolving said first lacquer exposed to said radiation of small wave-length;
    (i) etching said substrate to obtain a small-sized opening; and
    (j) dissolving remaining portions of said first lacquer.

2. A method of manufacturing field effect transistors having an aligned gate in the submicron range from a semiconductor material covered with a first metallic layer, forming an ohmic contact with said semiconductor material, said semiconductor material having two zones constituting source and drain electrodes separated by a window in the micron range, characterised in that said method comprises the following steps:

(a) depositing a second layer of a lacquer sensitive to the radiations of small wave-length, such as X- or deep UV radiations, a third layer of a material opaque to said radiations, and a fourth layer of a lacquer sensitive to radiations of larger wave-length, such as ultra-violet radiations;

(b) exposing said fourth layer to a sensitizing ultra-violet radiation through a mask to expose at a center of said fourth layer a main center line of said window in the micron range;

(c) dissolving said sensitized lacquer with a suitable solution;

(d) etching uncovered portions of said third layer and under-etching over a distance typically less than 1 μm below said fourth layer;

(e) depositing a fifth layer of the same material as that of said third layer by alignment along the central edge of said fourth lacquer layer;

(f) removing non-sensitized lacquer by a suitable solution;

(g) exposing said second layer of lacquer to a sensitizing radiation of small wave-length, such as X-rays or deep UV radiations;

(h) removing sensitized lacquer of said second layer by another suitable solution;

(i) etching said semiconductor material so as to obtain a cavity;

(j) depositing a sixth metallic layer of a metal forming a rectifying contact with said semiconductor material so that in said cavity a gate electrode is formed by self-alignment along two adjacent edges of said center line, said adjacent edges being located at a relative distance typically less than 1 μm from said third layer; and (k) removing remaining non-exposed lacquer.

3. A method of manufacturing field effect transistors having an aligned gate in the submicron range as claimed in claim 2, characterised in that said semiconductor material is gallium arsenide.

4. A method of manufacturing field effect transistors having an aligned gate in the submicron range as claimed in claim 3, characterised in that said first metallic layer consists of an alloy of gold-germanium covered with nickel, and in that said sixth metallic layer consists of aluminium.

5. A method of manufacturing field effect transistors having an aligned gate in the submicron range as claimed in claim 4, characterised in that said lacquers are chosen so that their chemical removing solutions are different, and in that the sensitizing radiation of said fourth layer of lacquer has a larger wave-length than that of said second layer of lacquer so that said radiation can be shielded by said third layer disposed between said second and fourth layers.

6. A method of manufacturing field effect transistors having an aligned gate in the submicron range as claimed in claim 3, characterized in that said lacquers are chosen so that their chemical removing solutions are different, and in that the sensitizing radiation of said fourth layer of lacquer has a larger wave-length than that of said second layer of lacquer so that said radiation can be shielded by said third layer disposed between said second and fourth layers.

7. A method of manufacturing field effect transistors having an aligned gate in the submicron range as claimed in claim 2, characterized in that said first metallic layer consists of an alloy of gold-germanium covered with nickel, and in that said sixth metallic layer consists of aluminum.

8. A method of manufacturing field effect transistors having an aligned gate in the submicron range as claimed in claim 7, characterized in that said lacquers are chosen so that their chemical removing solutions are different, and in that the sensitizing radiation of said fourth layer of lacquer has a larger wave-length than that of said second layer of lacquer so that said radiation can be shielded by said third layer disposed between said second and fourth layers.

9. A method of manufacturing field effect transistors having an aligned gate in the submicron range as claimed in claim 2, characterized in that said lacquers are chosen so that their chemical removing solutions are different, and in that the sensitizing radiation of said fourth layer of lacquer has a larger wave-length than that of said second layer of lacquer so that said radiation can be shielded by said third layer disposed between said second and fourth layers.

* * * * *